US009269683B2

(12) United States Patent
Daubenspeck et al.

(10) Patent No.: US 9,269,683 B2
(45) Date of Patent: Feb. 23, 2016

(54) INTEGRATED CIRCUIT CHIP WITH PYRAMID OR CONE-SHAPED CONDUCTIVE PADS FOR FLEXIBLE C4 CONNECTIONS AND A METHOD OF FORMING THE INTEGRATED CIRCUIT CHIP

(71) Applicant: International Business Machines Corporation, Armonk, NY (US)

(72) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Timothy D. Sullivan, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 95 days.

(21) Appl. No.: 14/200,613

(22) Filed: Mar. 7, 2014

(65) Prior Publication Data

US 2014/0187034 A1 Jul. 3, 2014

Related U.S. Application Data

(62) Division of application No. 12/634,741, filed on Dec. 10, 2009, now Pat. No. 8,766,439.

(51) Int. Cl.
*H01L 23/12* (2006.01)
*H01L 23/00* (2006.01)
*H01L 23/498* (2006.01)

(52) U.S. Cl.
CPC .......... *H01L 24/11* (2013.01); *H01L 23/49816* (2013.01); *H01L 24/13* (2013.01); *H01L 24/81* (2013.01); *H01L 2224/1147* (2013.01); *H01L 2224/11901* (2013.01);

(Continued)

(58) Field of Classification Search
CPC ......... H01L 24/11; H01L 24/13; H01L 24/81; H01L 23/49816
See application file for complete search history.

(56) References Cited

U.S. PATENT DOCUMENTS 5,633,204 A 5/1997 Tago et al.
5,907,317 A 5/1999 Tanaka et al.
(Continued)

OTHER PUBLICATIONS

Watanabe, et al., "A Large Number of I/O Connections Using Compliant Bump," Electronic Components and Technology Conference, IEEE, 2006, pp. 126-130.

(Continued)

*Primary Examiner* — Mark Tornow
(74) *Attorney, Agent, or Firm* — Gibb & Riley, LLC; David A. Cain, Esq.

(57) ABSTRACT

Disclosed is a chip and method of forming the chip with improved conductive pads that allow for flexible C4 connections with a chip carrier or with another integrated circuit chip. The pads have a three-dimensional geometric shape (e.g., a pyramid or cone shape) with a base adjacent to the surface of the chip, a vertex opposite the base and, optionally, mushroom-shaped cap atop the vertex. Each pad can include a single layer of conductive material or multiple layers of conductive material (e.g., a wetting layer stacked above a non-wetting layer). The pads can be left exposed to allow for subsequent connection to corresponding solder bumps on a chip carrier or a second chip. Alternatively, solder balls can be positioned on the conductive pads to allow for subsequent connection to corresponding solder-paste filled openings on a chip carrier or a second chip.

12 Claims, 16 Drawing Sheets

(52) U.S. Cl.
CPC ............... *H01L 2224/11902* (2013.01); *H01L 2224/136* (2013.01); *H01L 2224/13018* (2013.01); *H01L 2224/13019* (2013.01); *H01L 2224/1357* (2013.01); *H01L 2224/1362* (2013.01); *H01L 2224/13144* (2013.01); *H01L 2224/13147* (2013.01); *H01L 2224/13155* (2013.01); *H01L 2224/13609* (2013.01); *H01L 2224/13611* (2013.01); *H01L 2224/13613* (2013.01); *H01L 2224/13618* (2013.01); *H01L 2224/13639* (2013.01); *H01L 2224/13647* (2013.01); *H01L 2224/1601* (2013.01); *H01L 2224/81191* (2013.01); *H01L 2224/81193* (2013.01); *H01L 2224/81801* (2013.01); *H01L 2924/00013* (2013.01); *H01L 2924/0103* (2013.01); *H01L 2924/014* (2013.01); *H01L 2924/01005* (2013.01); *H01L 2924/0105* (2013.01); *H01L 2924/01013* (2013.01); *H01L 2924/01022* (2013.01); *H01L 2924/01024* (2013.01); *H01L 2924/01029* (2013.01); *H01L 2924/01033* (2013.01); *H01L 2924/01046* (2013.01); *H01L 2924/01049* (2013.01); *H01L 2924/01051* (2013.01); *H01L 2924/01074* (2013.01); *H01L 2924/01078* (2013.01); *H01L 2924/01079* (2013.01); *H01L 2924/01082* (2013.01); *H01L 2924/14* (2013.01); *H01L 2924/19041* (2013.01)

(56) References Cited

U.S. PATENT DOCUMENTS

| | | | |
|---|---|---|---|
| 6,091,141 A * | 7/2000 | Heo | 257/704 |
| 6,184,062 B1 | 2/2001 | Brofman et al. | |
| 6,458,411 B1 | 10/2002 | Goossen et al. | |
| 6,541,366 B1 * | 4/2003 | Chin et al. | 438/613 |
| 6,559,527 B2 * | 5/2003 | Brofman et al. | 257/678 |
| 6,767,817 B2 | 7/2004 | Farnworth et al. | |
| 6,767,819 B2 | 7/2004 | Lutz | |
| 7,271,497 B2 | 9/2007 | Joshi et al. | |
| 7,390,733 B2 * | 6/2008 | Saimen | 438/612 |
| 7,969,004 B2 | 6/2011 | Ohnishi | |
| 2001/0003296 A1 | 6/2001 | Morimoto et al. | |
| 2001/0040290 A1 | 11/2001 | Sakurai et al. | |
| 2003/0096495 A1 | 5/2003 | Ihara et al. | |
| 2003/0216023 A1 | 11/2003 | Wark et al. | |
| 2007/0018321 A1 | 1/2007 | Hiatt et al. | |
| 2009/0091030 A1 * | 4/2009 | Ohnishi | 257/737 |
| 2009/0146316 A1 | 6/2009 | Jadhav et al. | |
| 2009/0243096 A1 | 10/2009 | Tsai | |

OTHER PUBLICATIONS

U.S. Appl. No. 12/634,741, Office Action Communicated dated Dec. 19, 2011, 9 pages.
U.S. Appl. No. 12/634,741, Office Action Communicated dated Feb. 21, 2012, 14 pages.
U.S. Appl. No. 12/634,741, Office Action Communicated dated Aug. 2, 2012, 18 pages.
U.S. Appl. No. 12/634,741, Office Action Communication dated Sep. 7, 2012, 3 pages.
U.S. Appl. No. 12/634,741, Office Action Communicated dated Jan. 8, 2014, 11 pages.
U.S. Appl. No. 12/634,741, Notice of Allowance dated Feb. 20, 2014, 9 pages.

* cited by examiner

INTEGRATED CIRCUIT CHIP WITH PYRAMID OR CONE-SHAPED CONDUCTIVE PADS FOR FLEXIBLE C4 CONNECTIONS AND A METHOD OF FORMING THE INTEGRATED CIRCUIT CHIP

CROSS-REFERENCE TO RELATED APPLICATIONS

This application is a Divisional of U.S. application Ser. No. 12/634,741 filed Dec. 10, 2009, the complete disclosure of which, in its entirety, is herein incorporated by reference.

BACKGROUND

1. Field of the Invention

The embodiments generally relate to integrated circuit chips incorporated into electronic assemblies, such as flip-chip assemblies and stacked chip assemblies, using controlled collapsed chip connections (i.e., C4 connections). More particularly, the embodiments relate to an integrated circuit chip and a method of forming the chip with pyramid or cone-shaped conductive input/output (I/O) pads.

2. Description of the Related Art

As discussed in detail in U.S. Patent Application Publication No. 2009/0146316 of Jadhav et al., filed on Dec. 5, 2007, published on Jun. 11, 2009, assigned to International Business Machines Corporation of Armonk, N.Y., and incorporated herein by reference, in a flip-chip assembly an integrated circuit chip is typically mounted on a chip carrier by an array of controlled collapsed chip connections (i.e., C4 connections). The formation of such C4 connections usually involves the formation of solder balls on flat conductive pads on the active surface of an integrated circuit chip (e.g., on the same surface of the chip as the integrated circuit devices and, preferably, surrounding a core integrated circuit device region), thereby creating an array of solder bumps. Additionally, solder paste is deposited onto conductive pads within an array of openings (e.g., solder resist openings) on the surface of a chip carrier. The array of solder bumps on the integrated chip is aligned with the array of solder paste filled openings on the chip carrier. Next, the integrated circuit chip and chip carrier are pressed together and a reflow process is performed to create the solder joints (i.e., the C4 connections) that both electrically and mechanically connect the integrated circuit chip to the chip carrier. Similar C4 connections can be used to interconnect integrated circuit chips in a stacked chip assembly.

Unfortunately, during chip operation, stress-related cracks in the C4 connections and/or the integrated circuit chip(s) can form due to a mismatch in thermal expansion (e.g., between the integrated circuit chip and the chip carrier in a flip-chip assembly and between the multiple integrated circuit chips in a stacked chip assembly). Such stress-related cracks can result in chip failure. Furthermore, such stress-related cracks can increase exponentially with the use of an organic laminate substrate as the chip carrier in a flip-chip assembly, with the use of lead-free solder material and/or with smaller pitch C4 connections (i.e., with greater C4 connection density). Therefore, there is a need in the art for an improved C4 connection that will provide greater flexibility and, thereby improved integrated circuit chip reliability.

SUMMARY

More particularly, disclosed are embodiments of an integrated circuit chip that can be incorporated into an electronic assembly (e.g., into a flip-chip assembly or a stacked chip assembly). Each of the embodiments comprises a semiconductor substrate having a first surface and a second surface opposite the first surface. Devices can be positioned at the first surface of the semiconductor substrate (e.g., in a core device region). Conductive pads for I/O connections can be positioned either on the first surface (e.g., surrounding the core device region) or, alternatively, on the second surface. Each conductive pad can have a same three-dimensional geometric shape with a base adjacent to the semiconductor substrate and a vertex opposite the base. For example, each conductive pad can have a pyramid or cone shape. Optionally, each conductive pad can further comprise an essentially mushroom-shaped cap atop the vertex. Each conductive pad can comprise a single layer of conductive material. Alternatively, each conductive pad can comprise multiple layers of conductive material (e.g., a wetting layer stacked above a non-wetting layer). Each conductive pad can be left exposed to allow for subsequent connection to a corresponding solder bump on another component in the electronic assembly (e.g., on a chip carrier in the case of a flip-chip assembly or on a second integrated circuit chip in the case of a stacked chip assembly). Optionally, a solder ball can be positioned on each conductive pad covering the vertex (or cap, as applicable) so as to allow for subsequent connection to a corresponding solder paste-filled opening on another component in the electronic assembly (e.g., on a chip carrier in the case of a flip-chip assembly or on a second integrated circuit chip in the case of a stacked chip assembly).

Also disclosed herein are embodiments of a method of forming the above-described integrated circuit chip for incorporation into an electronic assembly (e.g., into a flip-chip assembly or a stacked chip assembly). Each of the method embodiments comprises providing a semiconductor substrate having a first surface and a second surface opposite the first surface. Devices can be formed at the first surface (e.g., in a core device region). Conductive pads for I/O connections can be formed either on the first surface (e.g., surrounding the core device region) or, alternatively, on the second surface. The conductive pads can be formed such that they each have a same three-dimensional geometric shape with a base adjacent to the semiconductor substrate and a vertex opposite the base (e.g., a pyramid or cone shape). Optionally, each conductive pad can further be formed so as to have an essentially mushroom-shaped cap atop the vertex. The conductive pads can be formed, for example, so as to comprise a single layer of conductive material. Alternatively, the conductive pads can be formed so as to comprise multiple layers of conductive material (e.g., a wetting layer stacked above a non-wetting layer). After the conductive pads are formed, they can be left exposed to allow for subsequent connection to a corresponding solder bump on another component in the electronic assembly (e.g., on a chip carrier in the case of a flip-chip assembly or on a second integrated circuit chip in the case of a stacked chip assembly). Alternatively, after the conductive pads are formed, a solder ball can be form on each conductive pad covering the vertex (or cap, as applicable) so as to allow for subsequent connection to a corresponding solder paste-filled opening on another component in the electronic assembly (e.g., on a chip carrier in the case of a flip-chip assembly or on a second integrated circuit chip in the case of a stacked chip assembly).

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1A:
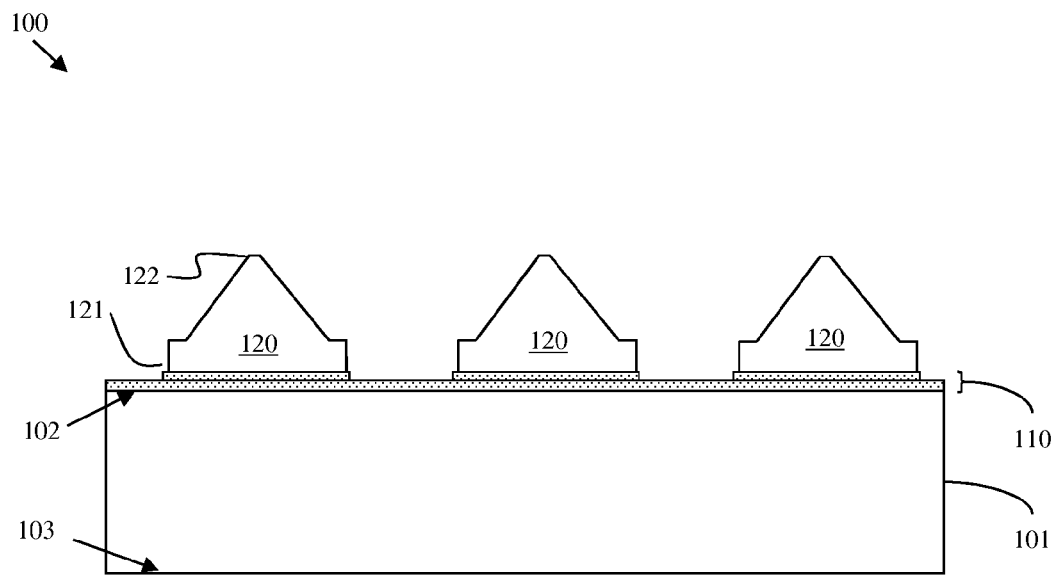
FIG. 1A is a cross-section diagram illustrating an embodiment of an integrated circuit chip with three-dimensional conductive pads.

The embodiments of the invention and the various features and advantageous details thereof are explained more fully with reference to the non-limiting embodiments that are illustrated in the accompanying drawings and detailed in the following description.

As mentioned above and discussed in detail in U.S. Patent Application Publication No. 2009/0146316 of Jadhav et al., filed on Dec. 5, 2007, published on Jun. 11, 2009, assigned to International Business Machines Corporation of Armonk, N.Y., and incorporated herein by reference, in a flip-chip assembly an inverted integrated circuit chip is typically mounted on a chip carrier by an array of controlled collapsed chip connections (i.e., C4 connections). The formation of such C4 connections usually involves the formation of solder balls on flat conductive pads on the active surface of an integrated circuit chip (e.g., on the same surface of the chip as the integrated circuit devices and, preferably, surrounding a core integrated circuit device region), thereby creating an array of solder bumps. Additionally, solder paste is deposited onto conductive pads within an array of solder resist openings on the surface of a chip carrier. The array of solder bumps on the integrated chip is aligned with the array of solder paste filled openings on the chip carrier. Next, the integrated circuit chip and chip carrier are pressed together and a reflow process is performed to create the solder joints (i.e., the C4 connections) that both electrically and mechanically connect the integrated circuit chip to the chip carrier. Similar C4 connections can be used to interconnect integrated circuit chips in a stacked chip assembly.

Unfortunately, during chip operation, stress-related cracks in the C4 connections and/or the integrated circuit chip(s) can form due to a mismatch in thermal expansion (e.g., between the integrated circuit chip and the chip carrier in a flip-chip assembly and between the multiple integrated circuit chips in a stacked chip assembly). Such stress-related cracks can result in chip failure. Furthermore, such stress-related cracks can increase exponentially with the use of an organic laminate substrate as the chip carrier in a flip-chip assembly, with the use of lead-free solder material and/or with smaller pitch C4 connections (i.e., with greater C4 connection density). Therefore, there is a need in the art for an improved C4 connection that will provide greater flexibility and, thereby improved integrated circuit chip reliability.

In view of the foregoing disclosed herein are embodiments of an integrated circuit chip with improved conductive input/output (I/O) pads that allow for flexible controlled collapsed chip connections (i.e., flexible C4 connections) with another component in an electronic assembly (e.g., with a chip carrier in a flip-chip assembly or with another integrated circuit chip in a stacked chip assembly). Specifically, the integrated circuit chip can comprise a semiconductor substrate. Device can be positioned at a first surface of the substrate (e.g., in a core device region). Additionally, conductive pads can be positioned either on the first surface of the substrate (e.g., surrounding the core device region) or, alternatively, on the second surface of the substrate. These conductive pads can each have a same three-dimensional geometric shape (e.g., a pyramid or cone shape) with a base adjacent to the semiconductor substrate, a vertex opposite the base and, optionally, an essentially mushroom-shaped cap atop the vertex. Each conductive pad can comprise a single layer of conductive material or multiple layers of conductive material (e.g., a wetting layer stacked above a non-wetting layer). The conductive pads can be left exposed to allow for subsequent connection to corresponding solder bumps on another component of an electronic assembly. Alternatively, solder balls can be positioned on the conductive pads to allow for subsequent connections to corresponding solder-paste filled openings on another component of an electronic assembly. Conductive pads configured in this manner allow for an increase in the distance between electronic assembly components (i.e., an increase in stand off height) and also a flexible cushion between such electronic assembly components. Also disclosed herein are method embodiments for forming the above-described integrated circuit chip and electronic assemblies.

Figure 1B:
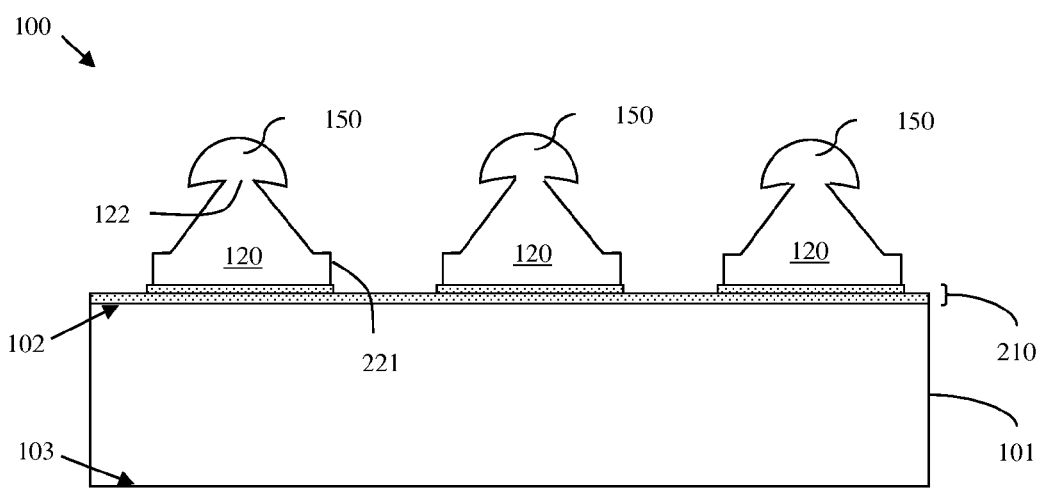
FIG. 1B is a cross-section diagram illustrating an embodiment of an integrated circuit chip with capped three-dimensional conductive pads.
Figure 2:
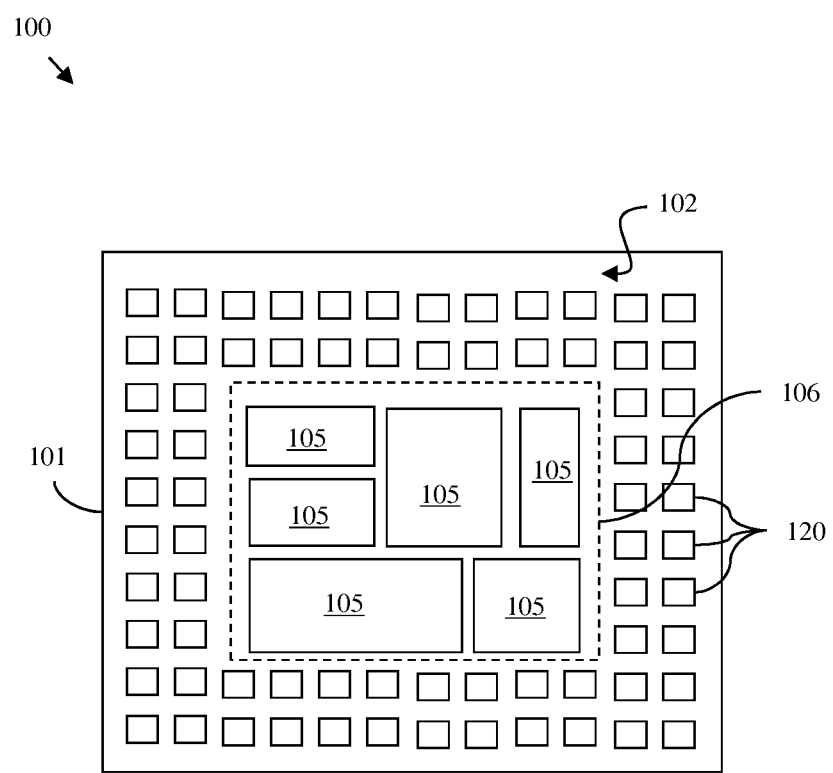
FIG. 2 is a top view diagram illustrating the integrated circuit chip of FIG. 1A or FIG. 1B.

More particularly, referring to FIGS. 1A and 1B in combination with FIG. 2, disclosed are embodiments of an integrated circuit chip 100. The integrated circuit chip 100 can comprise a semiconductor substrate 101 having a first surface 102 (e.g., a front surface or active surface) and a second surface 103 (e.g., a back surface) opposite the first surface 102. The integrated circuit chip 100 can further comprise one or more integrated circuit chip devices 105 (e.g., transistors, capacitors, resistors, etc.) positioned at the first surface 102 of the semiconductor substrate 101, for example, in a core integrated circuit device region 106. Additionally, the integrated circuit chip 100 can comprise conductive pads 120 for I/O connections with the devices 105.

The conductive pads 120 can be positioned on a surface of the semiconductor substrate 101 and can, optionally, be separated there from by ball limiting metallurgy (BLM) layers 110. That is, BLM layers 110 can be positioned between the semiconductor substrate 101 and the conductive pads 120. These BLM layers 110 can comprise, for example, an adhesion layer (e.g., a chromium (Cr) layer, a titanium (Ti) layer, a titanium-tungsten (Ti—W) layer or any other suitable adhesion layer) on the semiconductor substrate 101, a barrier layer (e.g., a nickel (Ni) layer, a nickel-copper (Ni—Cu) layer, a palladium (Pd) layer, a platinum (Pt) layer, a chromium-copper (Cr—Cu) layer or any other suitable layer for preventing electro-migration) on the adhesion layer and a bonding layer (e.g., a copper (Cu) layer, a gold (Au) layer or any other suitable bonding layer) on the barrier layer.

These conductive pads 120 can be positioned on the same surface of the semiconductor substrate 101 as the devices 105. For example, the conductive pads 120 can be positioned on the first surface 102 of the semiconductor substrate 101 surrounding the core device region 106, as shown in FIG. 2. Alternatively, these conductive pads 120 can be positioned on the surface of the semiconductor substrate 101 opposite the devices 105. For example, the conductive pads 120 can be positioned on the second surface 103 of the semiconductor substrate 101 and interconnecting vias can extend vertically through the semiconductor substrate 101 to connect the conductive pads 120 and devices 105 (not shown).

Figure 3A:
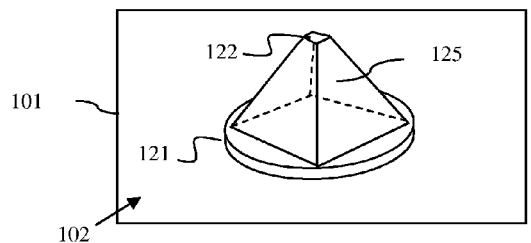
FIG. 3A is a cross-section diagram illustrating an exemplary pyramid-shaped conductive pad.
Figure 3B:
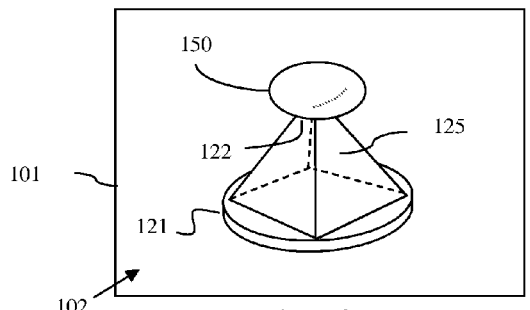
FIG. 3B is a cross-section diagram illustrating an exemplary capped pyramid-shaped conductive pad.
Figure 4A:
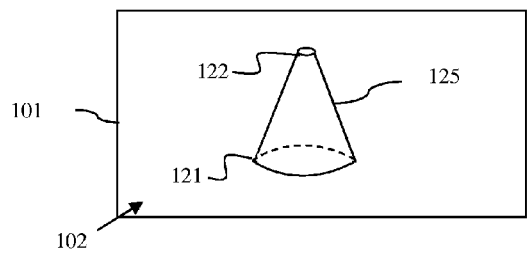
FIG. 4A is a cross-section diagram illustrating an exemplary cone-shaped conductive pad with a linear sidewall.
Figure 4B:
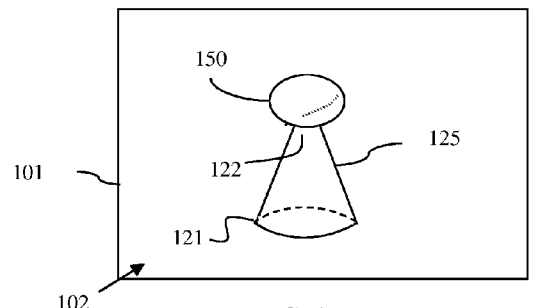
FIG. 4B is a cross-section diagram illustrating an exemplary capped cone-shaped conductive pad with a linear sidewall.
Figure 5A:
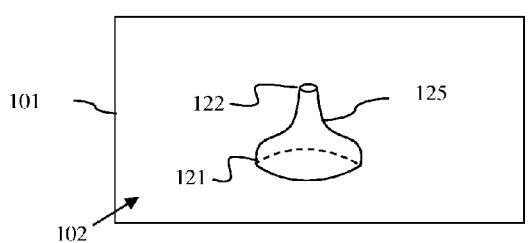
FIG. 5A is a cross-section diagram illustrating an exemplary cone-shaped conductive pad with a curved sidewall.
Figure 5B:
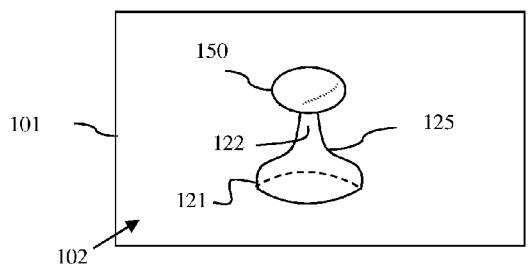
FIG. 5B is a cross-section diagram illustrating an exemplary capped cone-shaped conductive pad with a curved sidewall.

Each conductive pad 120 can have a same solid three-dimensional geometric shape with a base 121 adjacent to the semiconductor substrate 101 (e.g., adjacent to the active surface 102) and a vertex 122 (i.e., apex, peak, narrow point, etc.) opposite the base 122. For example, as shown in FIG. 3A, each conductive pad 120 can have a pyramid shape. For illustration purposes, this pyramid-shaped conductive pad is shown with four sidewalls 125; however, such a pyramid-shaped conductive pad could comprise any number of three or more sidewalls 125. Alternatively, as shown in FIGS. 4A and 5A, each conductive pad 120 can have a cone shape. The sidewall 125 of such a cone-shaped conductive pad 120 can be either linear (see FIG. 4A) or curved (see FIG. 5A). Optionally, each conductive pad 120 can further comprise an essentially mushroom-shaped cap 150 atop the vertex 122 (see FIGS. 1B, 3B, 4B and 5B).

Figures 6A, 6B:
FIG. 6A is a cross-section diagram illustrating an exemplary single-layered three-dimensional conductive pad.
FIG. 6B is a cross-section diagram illustrating an exemplary capped multi-layered three-dimensional conductive pad.

Each conductive pad 120 can comprise one or more conductive materials. For example, each conductive pad 120 can comprise a single layer of conductive material, such as a single layer of copper (Cu), a single layer of nickel (Ni), a single layer of a copper nickel alloy, a single layer of gold (Au), etc. Alternatively, each conductive pad 120 can comprise multiple layers of conductive material, such as a non-wetting layer 123 adjacent to the second side 103 of the substrate 101 and a wetting layer 124 stacked above the non-wetting layer 123 (see FIGS. 6A and 6B). For example, a copper (Cu) layer with oxidized sidewalls 125 or other suitable non-wetting layer 123 can be adjacent to the second side 103 of the substrate 101 and a nickel (Ni) layer or other suitable wetting layer 124 can be stacked above the non-wetting layer 123.

The conductive pads 120 can be left exposed, as shown in FIGS. 1A and 1B, to allow for subsequent connection to corresponding bumps 205 on another component 200 of an electronic assembly 500 (e.g., on a chip carrier in the case of a flip-chip assembly or on a second integrated circuit chip in the case of a stacked chip assembly) (see FIGS. 13A and 13B and FIGS. 14A and 14B described in greater detail below with regard to the method embodiments).

Figure 7A:
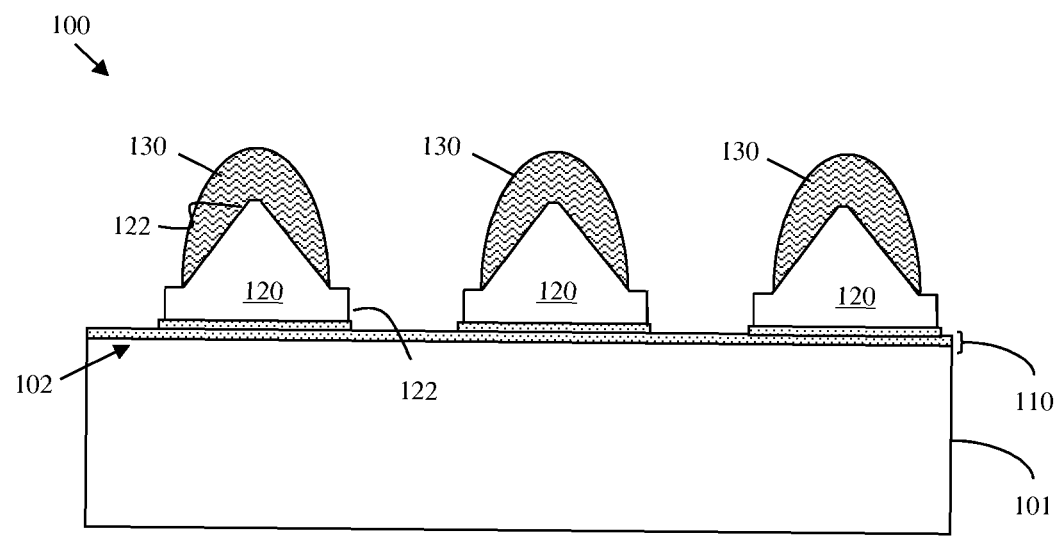
FIG. 7A is a cross-section diagram illustrating a solder ball on a three-dimensional conductive pad.
Figure 7B:
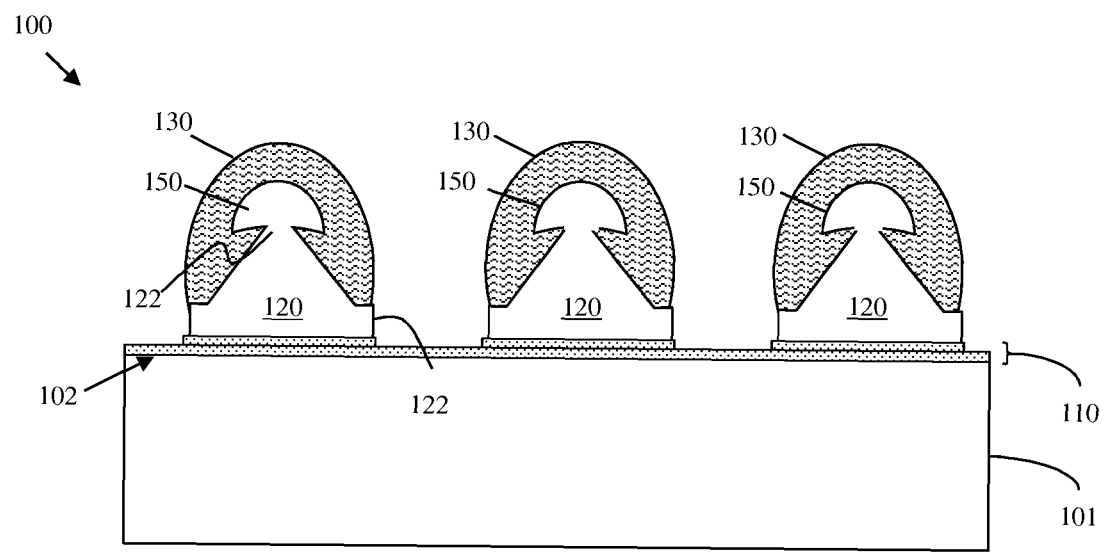
FIG. 7B is a cross-section diagram illustrating a solder ball on a capped three-dimensional conductive pad.
Figure 8A:
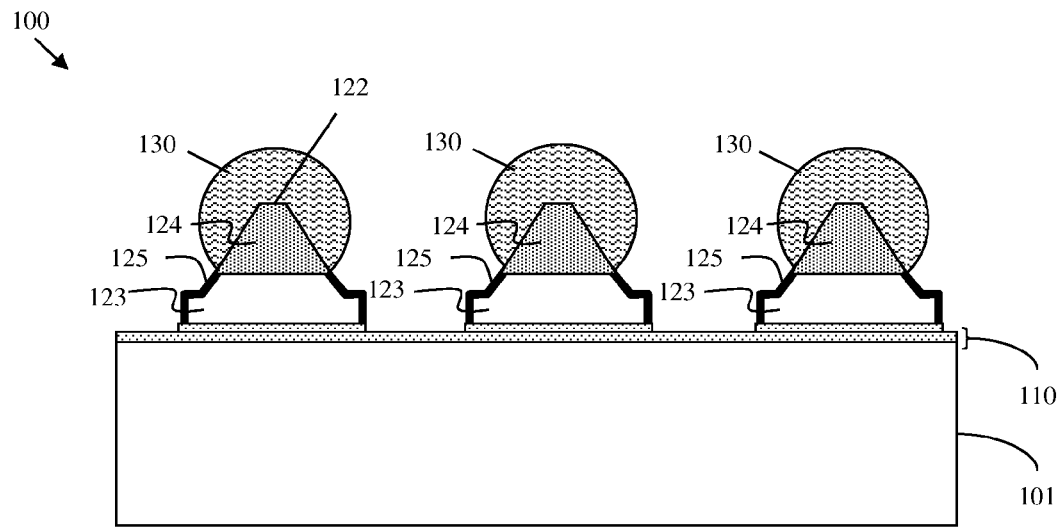
FIG. 8A is a cross-section diagram illustrating a solder ball on a multi-layered three-dimensional conductive pad.
Figure 8B:
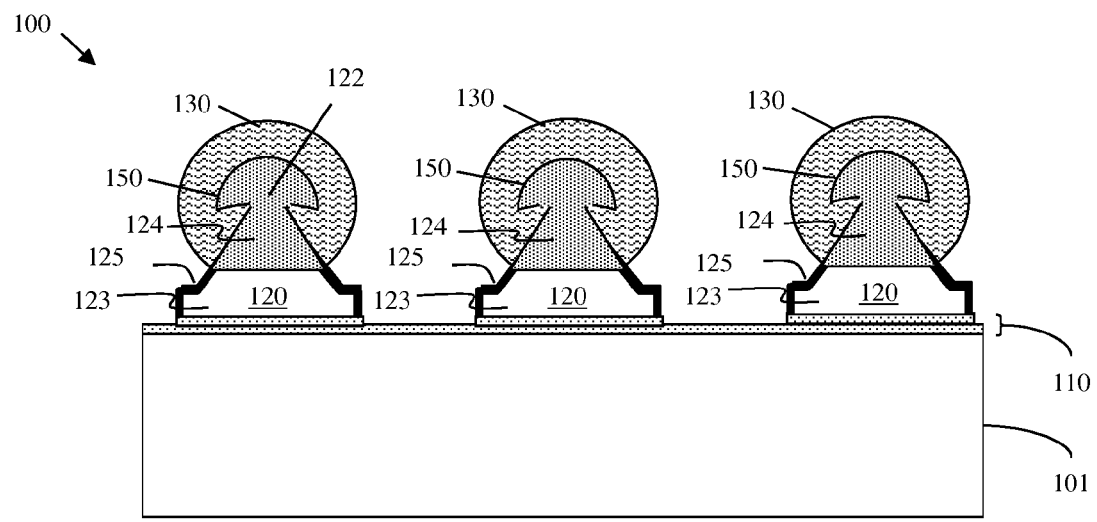
FIG. 8B is a cross-section diagram illustrating a solder ball on a capped multi-layered three-dimensional conductive pad.

Alternatively, a solder ball 130 can be positioned on each conductive pad 120 covering the vertex 122 or cap 150, as applicable (see FIGS. 7A and 7B and FIGS. 8A and 8B). Such solder balls 130 allows for subsequent connection to corresponding solder paste 204-filled openings 202 on a surface 201 of another component 200 of an electronic assembly 500 (e.g., on a chip carrier in the case of a flip-chip assembly or on a second integrated circuit chip in the case of a stacked chip assembly) (see FIGS. 18A and 18B and FIGS. 19A and 19B described in greater detail below with regard to the method embodiments). The solder balls 130 can comprise any suitable solder material (e.g., tin, copper sliver, bismuth, indium, zinc, and antimony), as long as that solder material has a reflow temperature that is lower than the melting temperature of the conductive materials in the conductive pad 120. Those skilled in the art will recognize that the shape and spread of the solder ball 130 will vary as a function of whether or not the conductive pad 120 is a single layer pad (see FIGS. 7A and 7B) or a multi-layer pad with stacked non-wetting 123 and wetting 124 layers (see FIGS. 8A and 8B). Furthermore, in the case of a multi-layer pad as shown in FIGS. 8A and 8B, the shape and spread of the solder ball 130, 230 will further vary as a function of the size of the wetting layer 124, 224.

Figure 9:
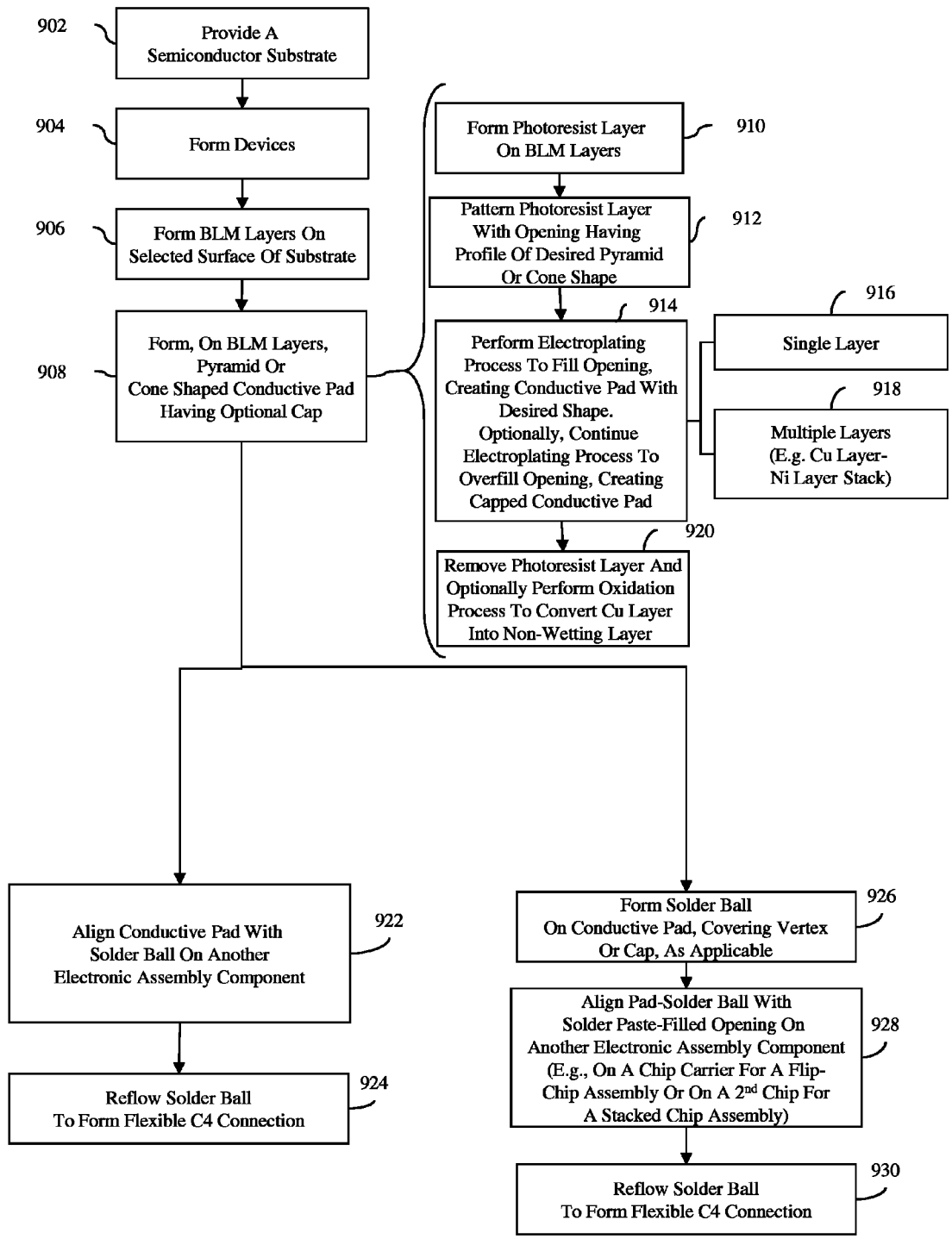
FIG. 9 is a flow diagram illustrating a method of forming an integrated circuit chip and further forming an electronic assembly incorporating the chip.

Referring to FIG. 9, also disclosed herein are embodiments of a method of forming the above-described integrated circuit chip and further forming an electronic assembly (e.g., a flip-chip assembly or stacked chip assembly) that incorporates such an integrated circuit chip.

Figure 10:
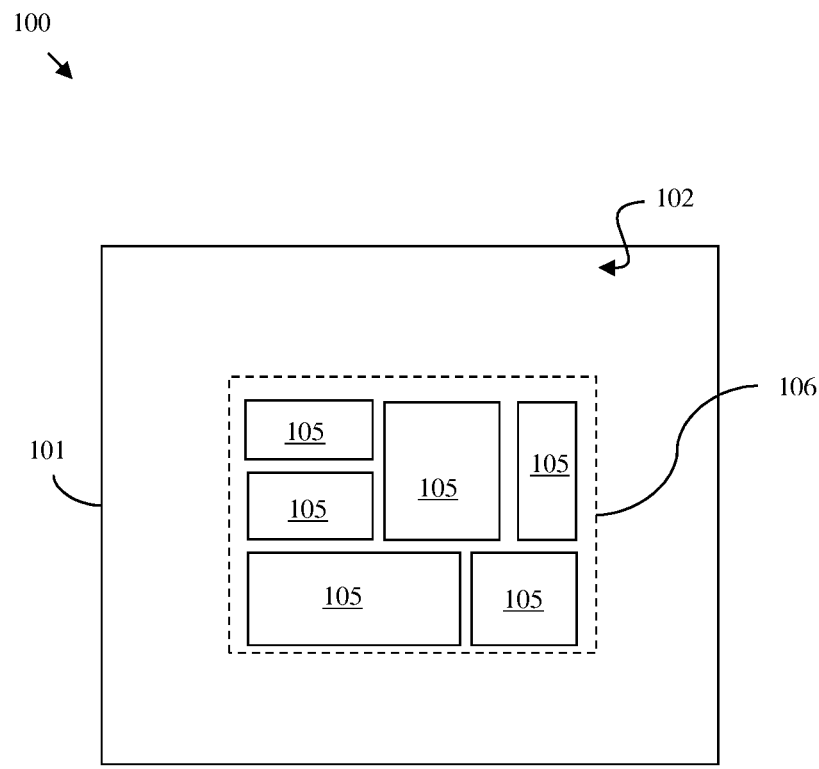
FIG. 10 is a top view diagram illustrating a partially completed integrated circuit chip formed according to the method of FIG. 9.

Each of the method embodiments comprises providing a semiconductor substrate 101 (e.g., a semiconductor wafer) having a first surface 102 (e.g., a front surface) and a second surface 103 (e.g., a back surface) opposite the first surface 102 (902). Integrated circuit chip devices 105 (e.g., transistors, capacitors, resistors, etc.) can be formed at the first surface 102 of the semiconductor substrate 101 in, for example, a core integrated circuit device region 106 (904, see FIG. 10). The process steps and, particularly, the front end of the line (FEOL) process steps used to form such devices are well-known in the art and, thus, are omitted from this specification in order to allow the reader to focus on the salient aspects of the embodiments described herein.

Next, conductive pads 120 for input/output (I/O) connections to the devices 105 can be formed on the semiconductor substrate 101 (908). These conductive pads 120 can be formed on the same surface of the semiconductor substrate 101 as the devices 105. For example, the conductive pads 120 can be formed on the first surface 102 of the semiconductor substrate 101 surrounding the core integrated circuit device region 106, as shown in FIG. 2. Alternatively, these conductive pads 120 can be formed on the surface of the semiconductor substrate 101 opposite the devices 105. For example, the conductive pads 120 can be formed on the second surface 103 of the semiconductor substrate 101. However, those skilled in the art will recognize that such an embodiment would further require the formation of interconnecting vias through the semiconductor substrate 101 to connect the conductive pads 120 and devices 105 (not shown). For illustration purposes, the method embodiments are described and illustrated below with the conductive pads 120 being formed on the same surface of the semiconductor substrate 101 as the devices 105 (i.e., on the first surface 102).

Figure 11:
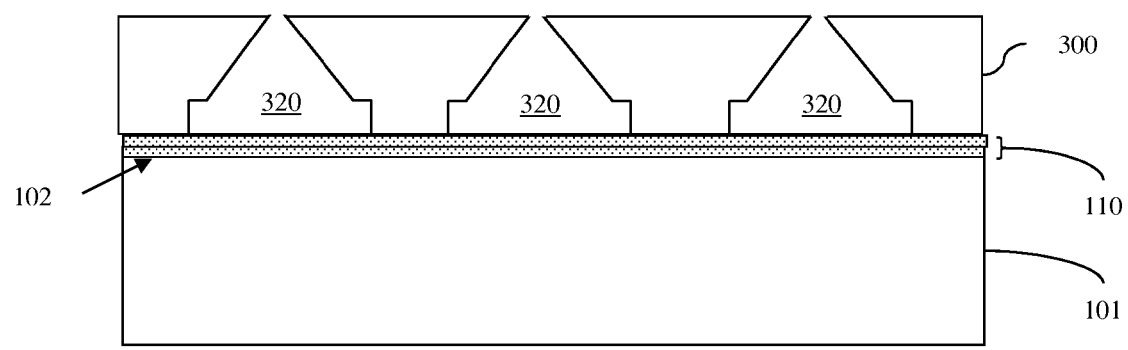
FIG. 11 is a cross-section view diagram illustrating a partially completed integrated circuit chip formed according to the method of FIG. 9.

In order to form such conductive pads at process 908, BLM layers 110 can first be formed (e.g., deposited) on the desired surface of the semiconductor substrate 101 (e.g., on the first surface 102) (906, see FIG. 11). These BLM layers 110 can comprise, for example, an adhesion layer (e.g., a chromium (Cr) layer, a titanium (Ti) layer, a titanium-tungsten (Ti—W) layer or any other suitable adhesion layer) on the substrate surface, a barrier layer (e.g., a nickel (Ni) layer, a nickel-copper (Ni—Cu) layer, a palladium (Pd) layer, a platinum (Pt) layer, a chromium-copper (Cr—Cu) layer or any other suitable layer for preventing electro-migration) on the adhesion layer and a bonding layer (e.g., a copper (Cu) layer, a gold (Au) layer or any other suitable bonding layer) on the barrier layer. Process steps used to form such BLM layers are well-known in the art and, thus, are omitted from this specification in order to allow the reader to focus on the salient aspects of the embodiments described herein.

The conductive pads 120 can then be formed on the BLM layers 110 such that each conductive pad 120 has a three-dimensional geometric shape and, more particularly, a pyramid or cone shape, with a base 121 adjacent to the semiconductor substrate 101, a vertex 121 (i.e., an apex, peak, narrow point, etc.) opposite the base 122 and, optionally, an essentially mushroom-shaped cap 150 atop the vertex 122 (see FIGS. 1A and 1B). In the method embodiments, pyramid-shaped conductive pads can be formed with any number of three or more sidewalls (e.g., see exemplary pyramid shaped conductive pad having four sidewalls in FIGS. 3A and 3B). Furthermore, the cone-shaped conductive pads can be formed with either a linear sidewall (see FIGS. 4A and 4B) or a curved sidewall (see FIGS. 5A and 5B).

Various techniques for forming such three-dimensional conductive pads are known in the art and it is anticipated that any such technique can be incorporated into the method embodiments described herein. One exemplary technique that can be used to form the conductive pads 120 at process 908 can comprise forming a photoresist layer 300 on the BLM layers 110 and, then, patterning the photoresist layer 300 with openings 320 (i.e., holes, trenches, etc.) that extend vertically to the top surface of the stack of BLM layers 110 and that each have a profile with the desired three-dimensional geometric shape (910-912, see exemplary pyramid-shaped openings in FIG. 11). Specifically, such openings 320 can be formed using a combination of lithography exposure techniques to cross link resist in a specific pattern through the z-axis and solvent develop techniques to selectively remove resist material in the desired cone or pyramid shape.

Figure 12A:
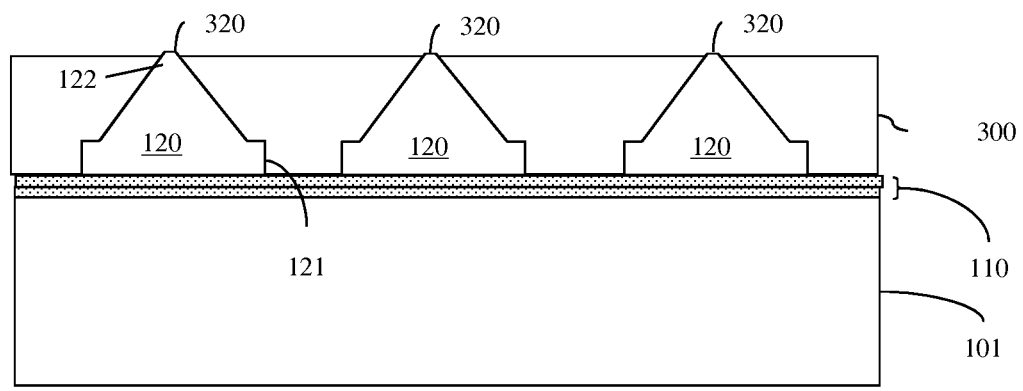
FIGS. 12A and 12B are cross-section view diagrams illustrating a partially completed integrated circuit chip formed according to the method of FIG. 9.

Once the openings 320 are formed, an electroplating process can be performed so as to fill the openings 320 with a conductive material 350, thereby creating the conductive pads 120 with the desired three-dimensional geometric shape and, more particularly, a three-dimensional shape having a base 121 adjacent to the selected surface of the semiconductor substrate 101 (e.g., adjacent to the first surface 102) and a vertex 121 (i.e., an apex, peak, narrow point, etc.) opposite the base 122 (914, see FIG. 12A). Process steps used to electroplate conductive material onto an exposed surface of a stack of BLM layers within an opening are well-known in the art and, thus, are omitted from this specification in order to allow the reader to focus on the salient aspects of the embodiments described herein. Optionally, this electroplating process 914 can continue so as to overfill the openings 320 with the conductive material 350, thereby creating essentially mushroom-shaped caps 150 (see FIG. 12B). Once the electroplating process 914 is complete, the photoresist layer 300 can be selectively removed (920, see FIGS. 1A and 1B).

Figure 12B:
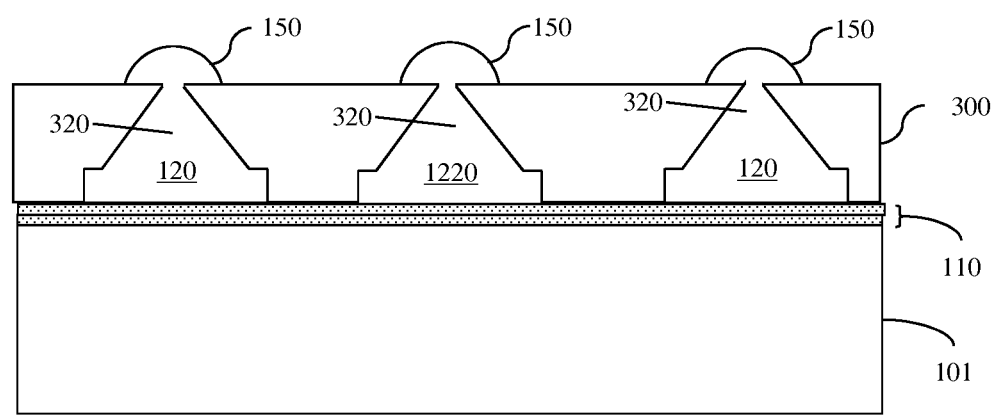
Figure 13A:
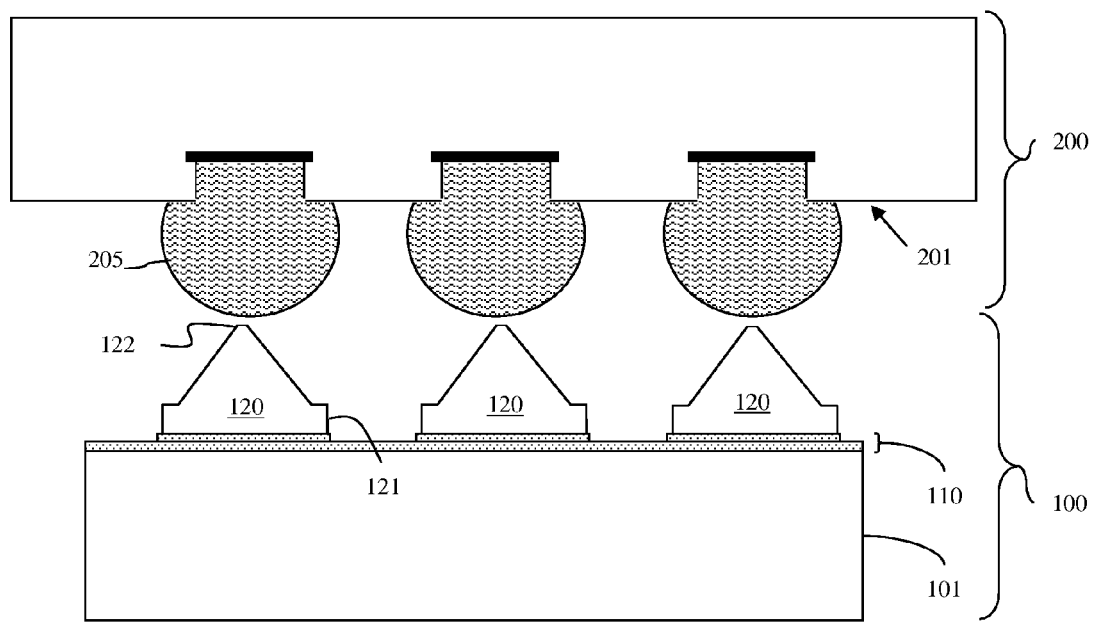
FIGS. 13A and 13B are cross-section view diagrams illustrating a partially completed electronic assembly formed according to the method of FIG. 9.
Figure 13B:
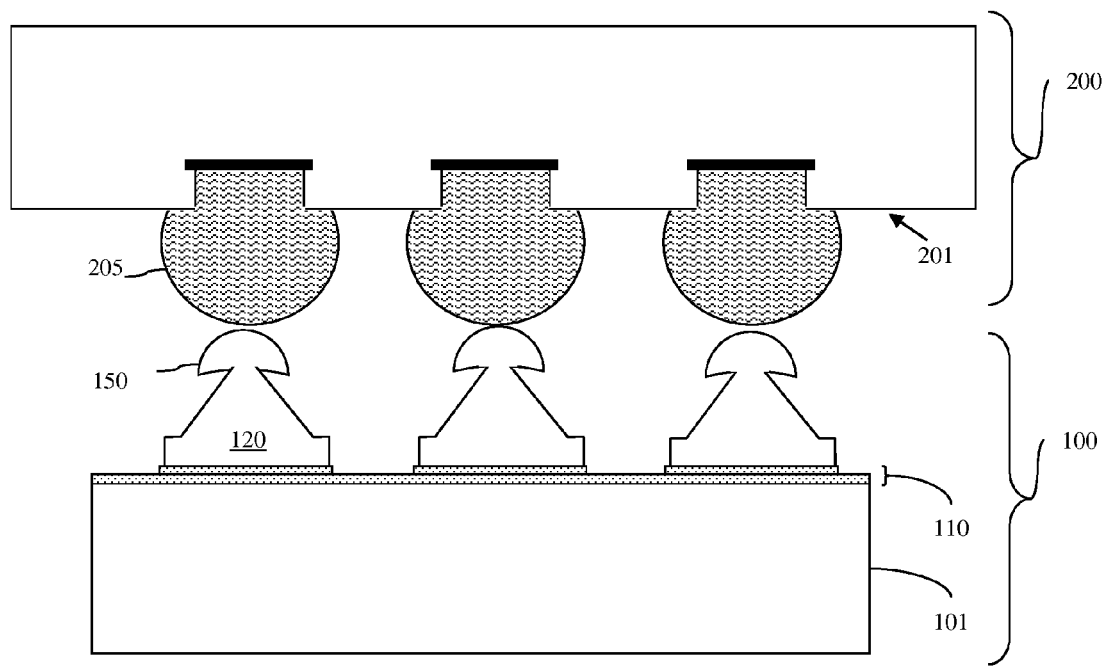
Figure 14A:
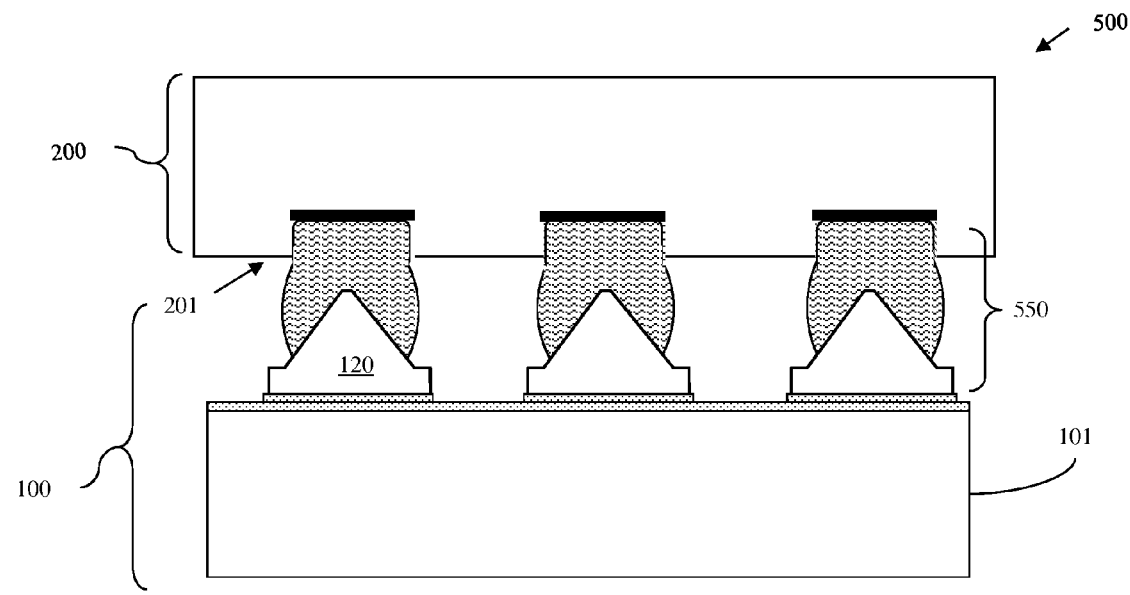
FIGS. 14A and 14B are cross-section view diagrams illustrating an electronic assembly formed according to the method of FIG. 9.
Figure 14B:
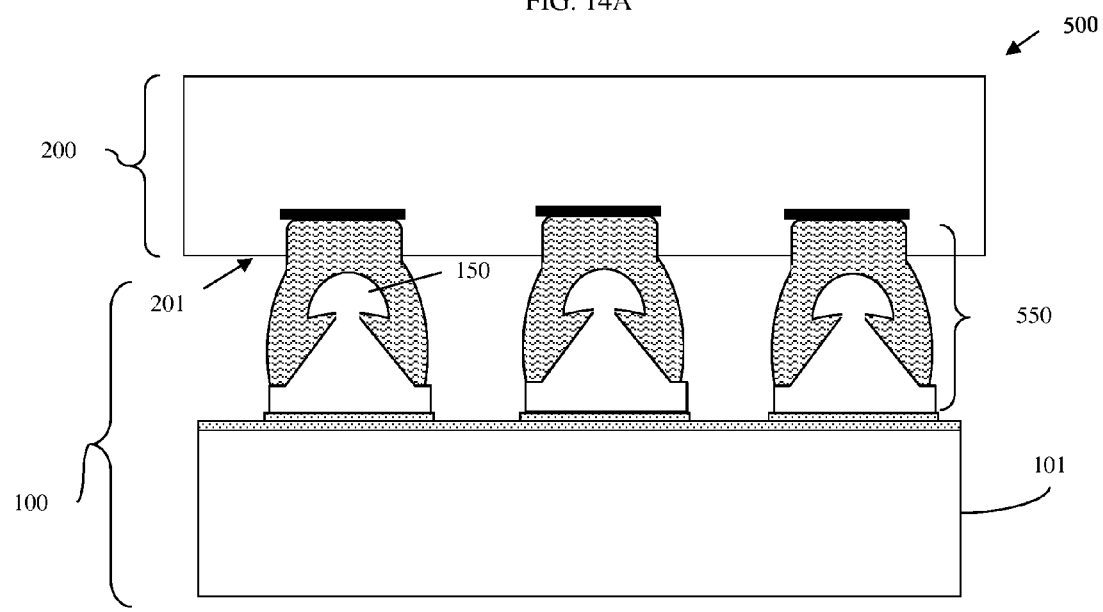

The conductive pads 120 of FIG. 12A or capped conductive pads 120 of FIG. 12B can be formed using single layer of conductive material 350 (916) or multiple layers of conductive material (918). For example, the electroplating process 914 can comprise electroplating a single layer of copper (Cu), a single layer of nickel (Ni), a single layer of a copper nickel alloy, a single layer of gold (Au), etc., so as to fill and, optionally, overfill the openings 320 (916). Alternatively, the electroplating process 914 can comprise electroplating a first layer 123 of conductive material such that the first layer 123 fills only a bottom portion of the openings 320 and, then, electroplating a second layer 124 of conductive material onto the first layer 123 in order to finish filling and, optionally, overfill the openings 320. The first layer 123 can be a different conductive material than the second layer 124.

For example, the first layer 123 can comprise a copper layer (Cu) layer or a non-wetting layer and the second layer 124 can comprise a nickel (Ni) layer or other suitable wetting layer. In the case of a Cu layer-Ni layer stack, after the photoresist layer 300 is removed at process 920, an optional oxidation process can be preformed so as to oxidize the exposed sidewalls 125 of the Cu layer, thereby converting the Cu layer into a non-wetting layer. Thus, the resulting multi-layer conductive pad structure can comprise a non-wetting layer (e.g., a copper (Cu) layer with oxidized sidewalls or other suitable non-wetting layer) adjacent to the BLM layers 110 on the second side 103 of the substrate and a wetting layer (e.g., a nickel (Ni) layer or other suitable wetting layer) stacked above the non-wetting layer.

At this point in the process, the conductive pads 120 can be left exposed on the surface of the semiconductor substrate 101, as shown in FIGS. 1A and 1B, to allow for subsequent connection to corresponding solder bumps on another component of an electronic assembly (e.g., on a chip carrier in the case of a flip-chip assembly or on a second integrated circuit chip in the case of a stacked chip assembly). Specifically, following conductive pad formation at process 908, the semiconductor substrate 101 can be diced into individual integrated circuit chips. Next, the conductive pads 120 on a given chip can be aligned with corresponding solder bumps 205 on the surface 201 of another electronic assembly component 200 (e.g., a chip carrier for a flip-chip assembly or a second integrated circuit chip for a stacked chip assembly) (922, see FIGS. 13A and 13B). Then, the components 100 and 200 are pressed together and a reflow process is performed to create solder joints 550 (i.e., C4 connections) that both electrically and mechanically connect the integrated circuit chip 100 to the other electronic assembly component 200 (i.e., the chip carrier or second integrated circuit chip, as applicable) and, thereby form the electronic assembly 500 (924, see FIGS. 14A and 14B).

Figure 15A:
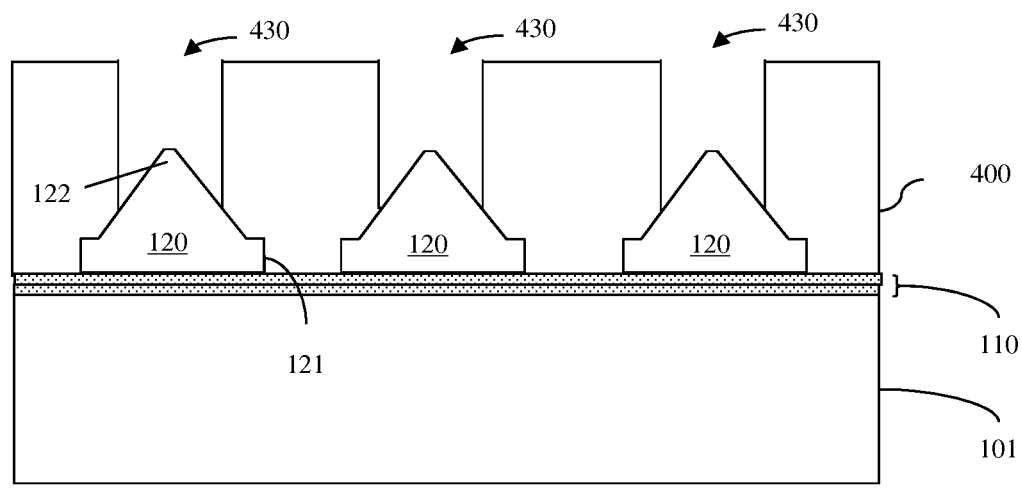
FIGS. 15A and 15B are cross-section view diagrams illustrating a partially completed integrated circuit chip formed according to the method of FIG. 9.
Figure 15B:
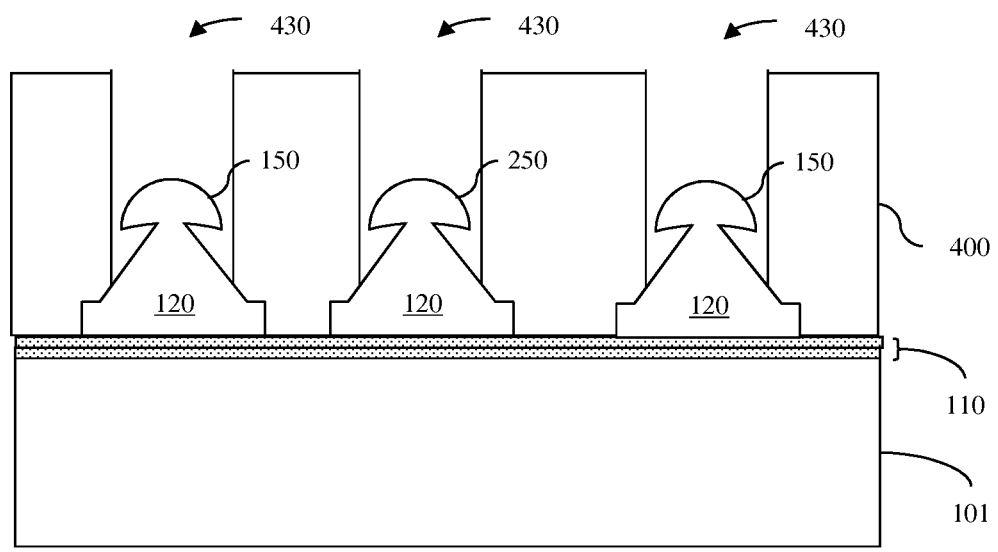
Figure 16A:
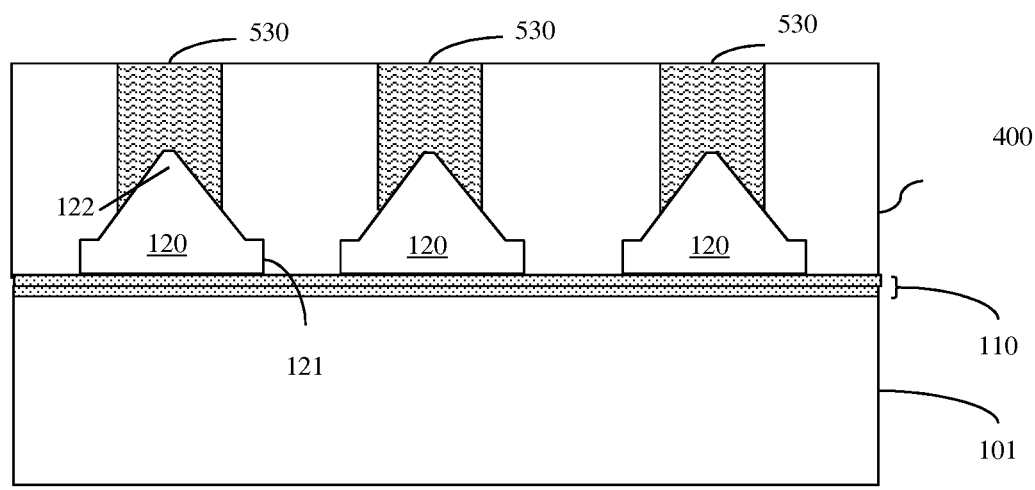
FIGS. 16A and 16B are cross-section view diagrams illustrating a partially completed integrated circuit chip formed according to the method of FIG. 9.
Figure 16B:
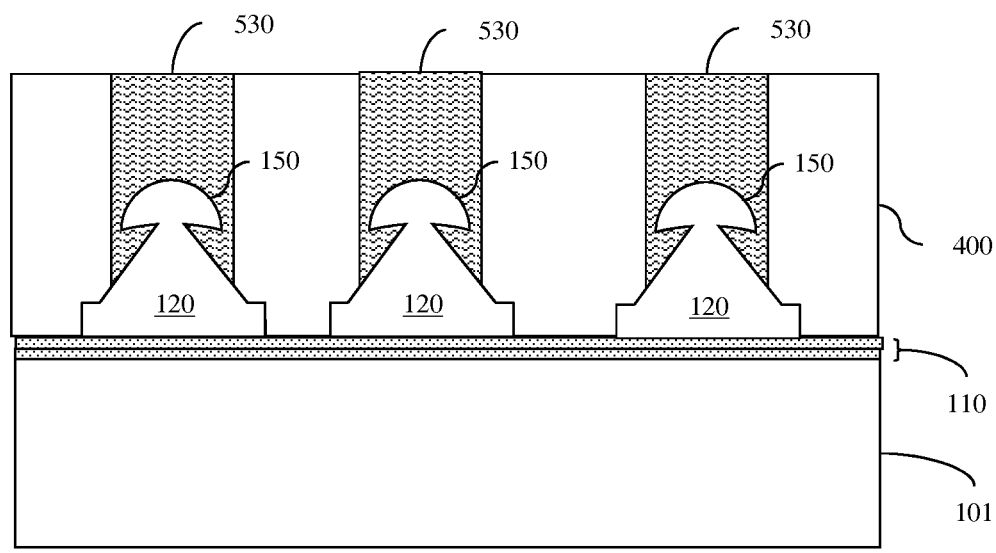
Figure 17A:
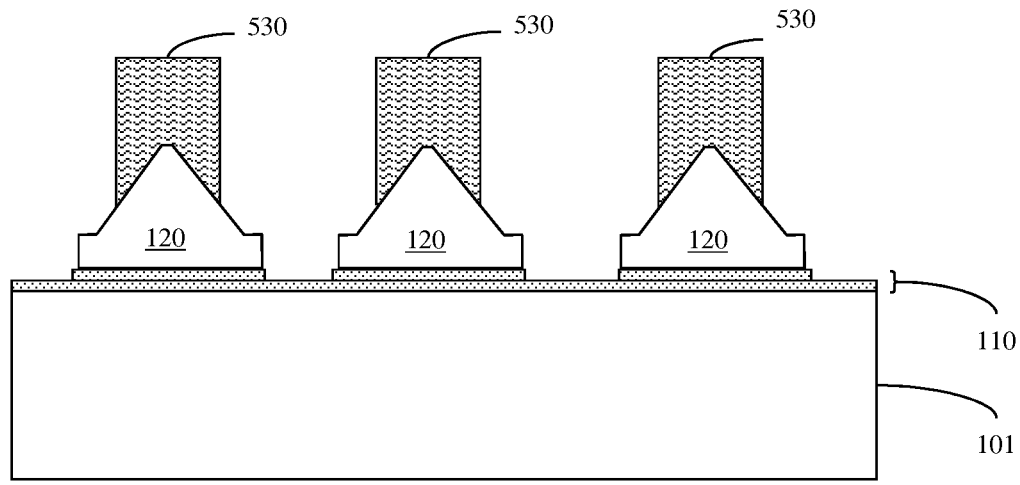
FIGS. 17A and 17B are cross-section view diagrams illustrating a partially completed integrated circuit chip formed according to the method of FIG. 9.
Figure 17B:
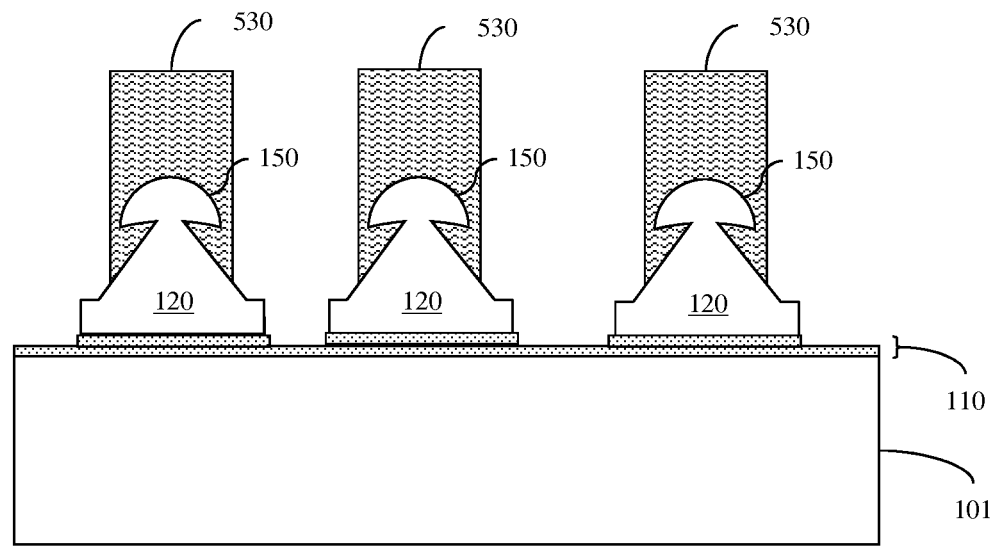
Figure 18A:
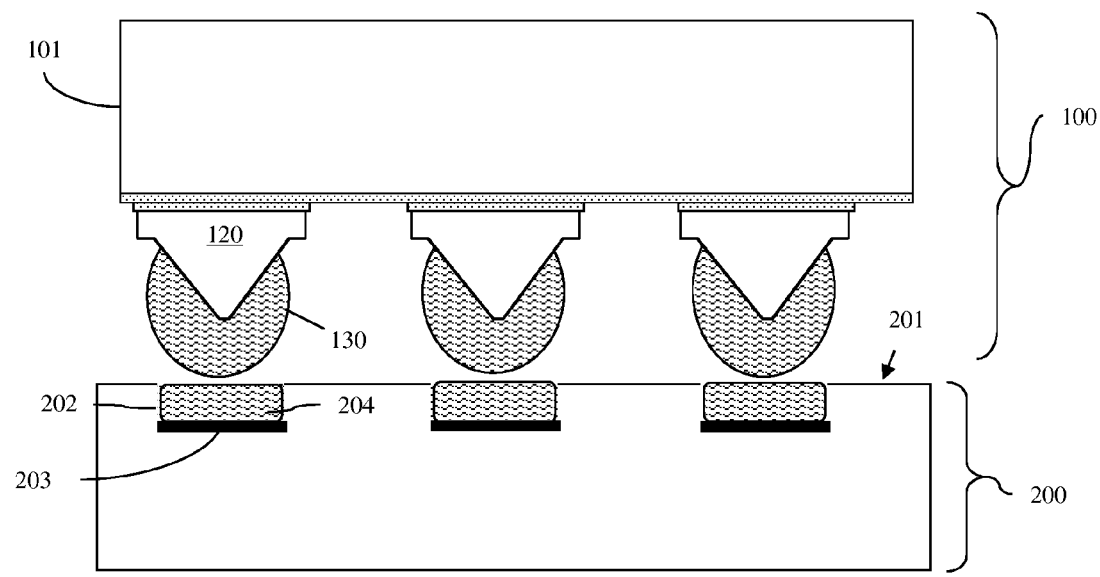
FIGS. 18A and 18B are cross-section view diagrams illustrating a partially completed electronic assembly formed according to the method of FIG. 9.
Figure 18B:
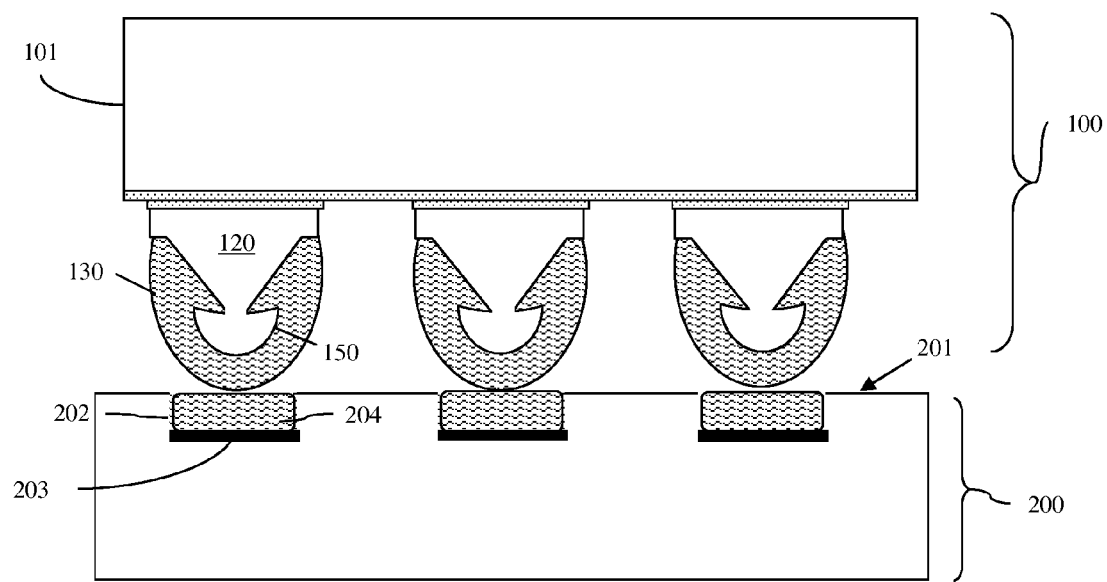
Figure 19A:
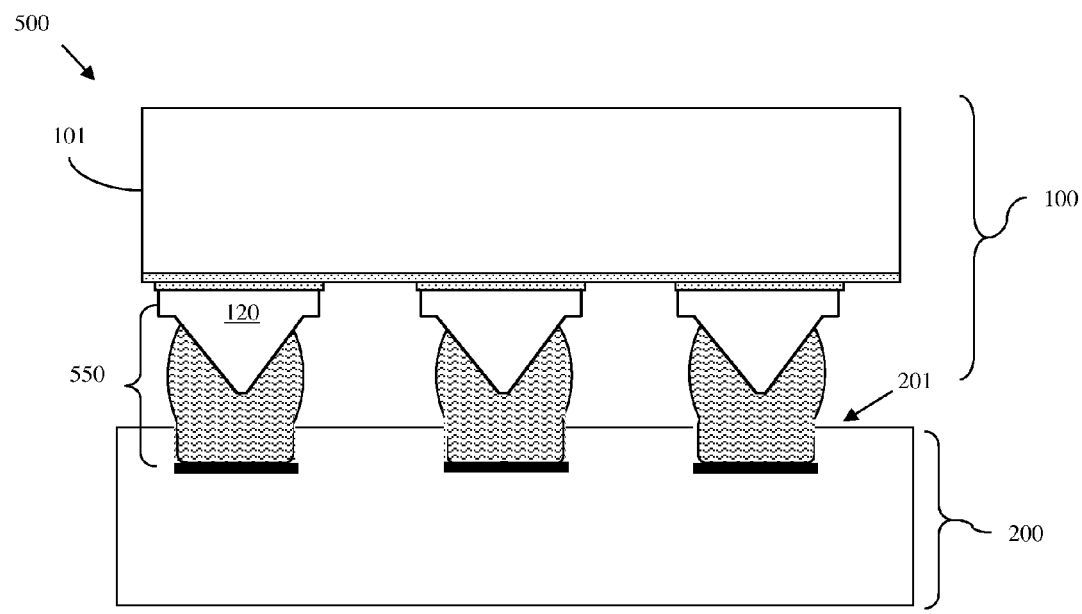
FIGS. 19A and 19B are cross-section view diagrams illustrating an electronic assembly formed according to the method of FIG. 9.
Figure 19B:
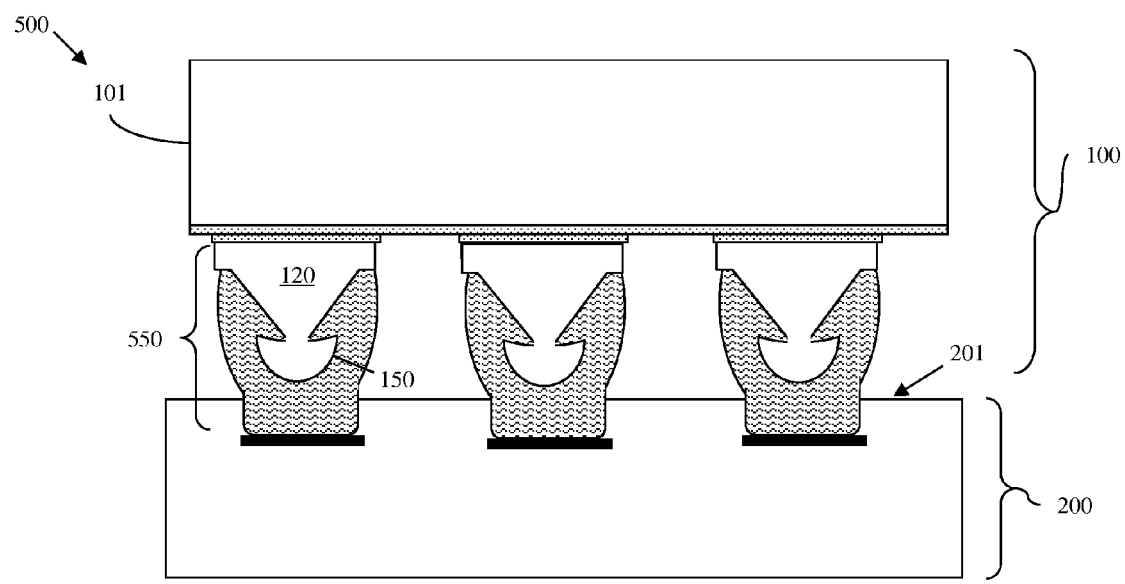

Alternatively, a solder ball 130 can be formed on each conductive pad 120 covering the vertex 122 or cap 150, as applicable (926, see FIGS. 7A and 7B and also FIGS. 8A and 8B). Specifically, an additional photoresist layer 400 can be formed on the semiconductor substrate 101 over the conductive pads 120 and, then, patterned, using conventional lithographic techniques, with additional openings 430 that expose upper portions only of the conductive pads 120 (see FIGS. 15A and 15B). Once the openings 430 are formed, a solder material 530 can be deposited into the openings 430 onto the exposed upper portions of the conductive pads 120 (see FIGS. 16A and 16B). The solder material 530 can comprise any suitable solder material (e.g., tin, copper sliver, bismuth, indium, zinc, and antimony), as long as that solder material has a reflow temperature that is lower than the melting temperature of the conductive materials in the conductive pad 120. Once the solder material 530 is deposited, the additional photoresist layer 400 can be selectively removed and exposed portions of one or more of the ball limiting metallurgy (BLM) layers 110 not covered by the conductive pads 120 can be selectively etched backed (see FIGS. 17A and 17B). Then, the structure can be heated so as to reflow the solder material 530, thereby creating solder balls 130 on top of the conductive pads 120. Those skilled in the art will recognize that the shape and spread of the solder balls 130 will vary as a function of whether or not the conductive pads 120 are single layer pads (see FIGS. 7A and 7B) or a multi-layer pads with stacked non-wetting 123 and wetting 124 layers (see FIGS. 8A and 8B). Furthermore, in the case of a multi-layer pad as shown in FIGS. 8A and 8B, the shape and spread of the solder ball 130 will further vary as a function of the size of the wetting layer 124.

Following solder ball 130 formation at process 926, the semiconductor substrate 101 can be diced into individual integrated circuit chips. Next, the array of conductive pads 120 topped with solder balls 130 on a given chip can be aligned with corresponding solder paste 204-filled openings 202 on a surface 201 of another electronic assembly component 200 (e.g., a chip carrier in the case of a flip-chip assembly or on a second integrated circuit chip in the case of a stacked chip assembly) (928, see FIGS. 18A and 18B). Then, the components 100 and 200 are pressed together and a reflow process is performed to create solder joints 550 (i.e., C4 connections) that both electrically and mechanically connect the integrated circuit chip 100 to the other electronic assembly component 200 (i.e., the chip carrier or second integrated circuit chip, as applicable) and, thereby form the electronic assembly 500 (930, see FIGS. 19A and 19B).

The method as described above is used in the fabrication of integrated circuit chips. The resulting integrated circuit chips can be distributed by the fabricator in raw wafer form (that is, as a single wafer that has multiple unpackaged chips), as a bare die following process steps 908 or 926 (as discussed above), or in a packaged form following steps 924 or 930 (as discussed above). In packaged form the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention. Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an integrated circuit chip with improved conductive input/output (I/O) pads that allow for flexible controlled collapsed chip connections (i.e., flexible C4 connections) with another component in an electronic assembly (e.g., with a chip carrier in a flip-chip assembly or with another integrated circuit chip in a stacked chip assembly). Specifically, the integrated circuit chip can comprise a semiconductor substrate. Device can be positioned at a first surface of the substrate (e.g., in a core device region). Additionally, conductive pads can be positioned either on the first surface of the substrate (e.g., surrounding the core device region) or, alternatively, on the second surface of the substrate. These conductive pads can each have a same three-dimensional geometric shape (e.g., a pyramid or cone shape) with a base adjacent to the semiconductor substrate, a vertex opposite the base and, optionally, an essentially mushroom-shaped cap atop the vertex. Each conductive pad can comprise a single layer of conductive material or multiple layers of conductive material (e.g., a wetting layer stacked above a non-wetting layer). The conductive pads can be left exposed to allow for subsequent connection to corresponding solder bumps on another component of an electronic assembly. Alternatively, solder balls can be positioned on the conductive pads to allow for subsequent connections to corresponding solder-paste filled openings on another component of an electronic assembly. Conductive pads configured in this manner allow for an increase in the distance between electronic assembly components (i.e., an increase in stand off height) and also a flexible cushion between such electronic assembly components. Also disclosed herein are method embodiments for forming the above-described integrated circuit chip and electronic assemblies.

What is claimed is:

1. A method of forming an integrated circuit chip, said method comprising:
   providing a semiconductor substrate having a first surface and a second surface opposite said first surface;
   forming a device at said first surface; and
   forming a conductive pad having a three-dimensional geometric shape with a base, a vertex opposite said base, and a cap on said vertex, said conductive pad being formed adjacent to any one of said first surface and said second surface and said forming of said conductive pad comprising forming said conductive pad such that said conductive pad comprises a first metal layer with oxidized sidewalls and a second metal layer stacked on said first metal layer and having conductive sidewalls.

2. The method of claim 1, forming a solder ball on said cap.

3. The method of claim 1, said forming of said conductive pad comprising:
   forming a photoresist layer on said semiconductor substrate;
   patterning said photoresist layer with an opening having one of a cone profile and a pyramid profile; and
   performing an electroplating process so as to fill and further overfill said opening with a conductive material such that said shape of said conductive pad comprises one of a cone and a pyramid with an essentially mushroom-shaped cap.

4. The method of claim 3, said conductive material comprising any of copper, nickel and a copper nickel alloy.

5. A method of forming an integrated circuit chip, said method comprising:
   providing a semiconductor substrate having a bottom surface and a top surface opposite said bottom surface;
   forming a device at said bottom surface;
   forming a conductive pad having a three-dimensional geometric shape with a base adjacent and a vertex opposite said base,
      said base having vertical sidewalls and being positioned on any one of said bottom surface and said top surface, and
      said conductive pad comprising a first metal layer adjacent to said semiconductor substrate and having oxidized sidewalls and a second metal layer stacked on said first metal layer and having conductive sidewalls; and
   forming a solder ball on said conductive pad such that said solder ball covers said vertex.

6. The method of claim 5, said forming of said conductive pad comprising:
   forming a photoresist layer on said semiconductor substrate;
   patterning said photoresist layer with an opening having one of a cone profile and a pyramid profile;
   performing an electroplating process so as to fill said opening with said first metal layer and said second metal layer stacked on said first metal layer, said opening being filled such that said shape of said conductive pad comprises one of a cone and a pyramid;
   removing said photoresist layer; and
   performing an oxidation process to form said oxidized sidewalls of said first metal layer.

7. The method of claim 6, said first metal layer comprising copper and said second metal layer comprising nickel.

8. The method of claim 6, said performing of said electroplating process comprising:
   electroplating said first metal layer in said opening adjacent to said semiconductor substrate, said first metal layer comprising a copper layer; and
   electroplating said second metal layer in said opening on said copper layer such that said second metal layer is stacked above said copper layer, said second metal layer comprising a nickel layer, and
   said oxidation process converting said copper layer into a non-wetting layer.

9. The method of claim 5, said forming of said solder ball comprising:
   forming an additional photoresist layer over said conductive pad;
   patterning an additional opening in said additional photoresist layer so as to expose an upper portion only of said conductive pad;
   depositing a solder material into said additional opening onto said upper portion of said conductive pad, said solder material comprising at least one of tin, copper, sliver, bismuth, indium, zinc, and antimony;
   removing said additional photoresist layer; and
   reflowing said solder material.

10. The method of claim 9, further comprising:
    before said forming of said conductive pad, forming ball limiting metallurgy (BLM) layers on said semiconductor substrate; and
    before said reflowing of said solder material, etching back at least a top one of said ball limiting metallurgy (BLM) layers not covered by said conductive pad.

11. The method of claim 5, said forming of said conductive pad comprising forming said conductive pad such that said based has a first maximum width and said forming of said solder ball comprising forming said solder ball such that said solder ball has a second maximum width that is no greater than said first maximum width and such that said solder ball has edges that are in direct physical contact with said conductive pad.

12. The method of claim 11, said edges of said solder ball being aligned with an interface between said oxidized sidewalls of said first metal layer and said conductive sidewalls of said second metal layer.

* * * * *